United States Patent
Chang et al.

(10) Patent No.: US 8,875,083 B2
(45) Date of Patent: Oct. 28, 2014

(54) ROUTING METHOD FOR FLIP CHIP PACKAGE AND APPARATUS USING THE SAME

(71) Applicant: Synopsys, Inc., Mountain View, CA (US)

(72) Inventors: Chen-Feng Chang, Taipei (TW); Chin-Fang Shen, Taipei (TW); Hsien-Shih Chiu, Taipei (TW); I-Jye Lin, Taipei (TW); Tien-Chang Hsu, Taipei (TW); Yao-Wen Chang, Taipei (TW); Chun-Wei Lin, Taipei (TW); Po-Wei Lee, Taipei (TW)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/045,090

(22) Filed: Oct. 3, 2013

(65) Prior Publication Data

US 2014/0033156 A1    Jan. 30, 2014

Related U.S. Application Data

(62) Division of application No. 13/504,374, filed as application No. PCT/IB2010/002738 on Oct. 27, 2010, now Pat. No. 8,578,317.

(30) Foreign Application Priority Data

Oct. 30, 2009 (CN) .......................... 2009 1 0209629
Oct. 30, 2009 (CN) .......................... 2009 1 0209631

(51) Int. Cl.
 *G06F 17/50* (2006.01)
 *H01L 23/00* (2006.01)
 *H01L 23/525* (2006.01)

(52) U.S. Cl.
 CPC ... *G06F 17/5077* (2013.01); *H01L 2924/01006* (2013.01); *H01L 24/02* (2013.01); *H01L 2924/014* (2013.01); *H01L 2224/14136* (2013.01); *H01L 24/14* (2013.01); *H01L*

(Continued)

(58) Field of Classification Search
 USPC .......................... 716/126, 129–130, 135, 138
 See application file for complete search history.

(56) References Cited

U.S. PATENT DOCUMENTS 6,016,391 A * 1/2000 Facchini et al. .................. 716/55
6,490,713 B2 * 12/2002 Matsumoto .................... 716/129

(Continued)

FOREIGN PATENT DOCUMENTS

CN           201570493 U      9/2010

OTHER PUBLICATIONS

Notification Concerning Transmittal dated May 10, 2012, the International Preliminary Report on Patentability (Chapter I of the Patent Cooperation Treaty) and the Written Opinion of the International Searching Authority from the corresponding International Application No. PCT/IB2010/002738 filed Oct. 27, 2010.

Primary Examiner — Naum Levin

(74) Attorney, Agent, or Firm — Young, Basile, Hanlon & MacFarlane, P.C.

(57) ABSTRACT

Disclosed herein are rouging methods and devices for a flip-chip package. The flip chip includes several outer pads and several inner pads. The routing method includes: setting an outer sequence based on the arrangement order of the outer pads; setting several inner sequences based on the connection relationships between inner pads and the outer pads; calculating the longest common subsequence of each inner sequence and the outer sequence, defining the connection relationships between the inner pads and the outer pads corresponding to the longest common subsequence as direct connections, and defining the connection relationships between the inner pads and the outer pads that do not correspond to the longest common subsequence as detour connections; establishing the routing scheme of the flip chip based on the connection relationships between the inner pads and the outer pads.

9 Claims, 14 Drawing Sheets

(52) U.S. Cl.
CPC ............ 2924/15311 (2013.01); *H01L 2924/14* (2013.01); *H01L 2924/01005* (2013.01); *H01L 2924/01033* (2013.01); *H01L 23/525* (2013.01); *H01L 2924/01051* (2013.01); *H01L 2924/01019* (2013.01); *H01L 2224/14131* (2013.01); *H01L 2224/02377* (2013.01); *H01L 2924/01074* (2013.01)
USPC ............ 716/135; 716/126; 716/129; 716/130; 716/138

(56) References Cited

U.S. PATENT DOCUMENTS

| | | | |
|---|---|---|---|
| 6,510,544 | B1 | 1/2003 | Matsumoto et al. |
| 6,516,446 | B2 * | 2/2003 | Anzai .......................... 716/112 |
| 6,574,780 | B2 | 6/2003 | Le Coz |
| 7,143,115 | B2 | 11/2006 | Jones et al. |
| 7,208,843 | B2 | 4/2007 | Richling et al. |
| 7,216,324 | B2 | 5/2007 | Chang |
| 7,243,327 | B1 | 7/2007 | Tain et al. |
| 7,496,878 | B2 | 2/2009 | Kitamura et al. |
| 7,871,831 | B1 | 1/2011 | Yao et al. |
| 8,281,297 | B2 | 10/2012 | Dasu et al. |
| 2001/0018760 | A1 | 8/2001 | Matsumoto |
| 2001/0039644 | A1 | 11/2001 | Le Coz |
| 2004/0098690 | A1 | 5/2004 | Joseph et al. |
| 2005/0229138 | A1 | 10/2005 | Kitamura et al. |
| 2006/0154402 | A1 | 7/2006 | Fang et al. |

* cited by examiner

| | $S_d$ | 1 | 2 | 1 | 3 | 4 | 3 |
|---|---|---|---|---|---|---|---|
| $S_b$ | 0 | 0 | 0 | 0 | 0 | 0 | 0 |
| 3 | 0 | 0 | 0 | 0 | 1 | 1 | 1 |
| 2 | 0 | 0 | 2 | 2 | 2 | 2 | 2 |
| 1 | 0 | 2 | 2 | 4 | 4 | 4 | 4 |
| 4 | 0 | 2 | 2 | 4 | 4 | 7 | 7 |

ROUTING METHOD FOR FLIP CHIP PACKAGE AND APPARATUS USING THE SAME

CROSS REFERENCE TO RELATED APPLICATION

This application is a divisional application of U.S. patent application Ser. No. 13/504,374 filed on Apr. 26, 2012 and issued on Nov. 5, 2013 as U.S. Pat. No. 8,578,317, which is a national stage application claiming priority to Chinese Patent Application No. 200910209631.3 filed on Oct. 30, 2009 and Chinese Patent Application No. 200910209629.6 filed on Oct. 30, 2009, all of which are incorporated herein by reference in their entirety.

TECHNICAL FIELD

The present invention pertains to a routing method and device, particularly to a routing method and device for a flip-chip package.

BACKGROUND

In company with the development of fabrication technology, the current integrated circuits have higher complexity and smaller size compared to the conventional integrated circuits. Therefore, a flip-chip package technology with relatively high integration density and relatively more input/output pins has been developed. The flip-chip package is a technology that can connect semiconductor elements to external circuits. The aforementioned external circuits may include package carriers or printed circuit boards. Compared to other packaging technologies, the merits of the flip-chip package technology include providing more area for input/output connections, reaching relatively high transmission rates with relatively little interference, and preventing interference from the external environmental factors.

The flip-chip package technology uses solder bumps deposited on the chip pads to establish connections to the external circuits. The aforementioned solder bumps are bump pads deposited on the top layer of the wafer in the final wafer fabrication stage. In order to mount the aforementioned chip on an external circuit, the chip is set upside down with its top layer facing down so that the bump pads are aligned with the pads of the external circuit. FIG. 1 shows a flip-chip package. As shown in FIG. 1, a chip 100 is mounted upside down on a package carrier 200. The top layer of the chip 100 has several bump pads 102, which are connected to the package carrier 200 via several solder bumps 104. The chip 100 also has several wire bonding pads or drier pads 106. FIG. 2 shows the cross section of the chip 100. As shown in FIG. 2, in order to lower the circuit design complexity and reduce the design modifications, the chip 100 has an extra metal layer known as a redistribution layer on the top metal layer of the chip 100 to connect the driver pads 106 to the bump pads 102.

Compared to pin grid array or ball grid array routing methods, the routing method for a flip-chip package has more restrictions and must satisfy the design rules of the fabrication process. The routing method for a flip-chip package can be classified into free assignment routing and pre-assignment routing. For the flip-chip package that uses free assignment routing, the corresponding relationships between the driver pads and the bump pads are determined by the user or the routing tool software. Therefore, the user or routing tool software has a relatively high degree of freedom for determining the routing paths between the driver pads and the bump pads. On the other hand, for a flip-chip package using pre-assignment routing, the corresponding relationships between the driver pads and the bump pads are predetermined. Therefore, the corresponding relationships cannot be changed when determining the routing. As a result, routing faces relatively more restrictions because the user or routing tool software can only perform routing according to the predetermined corresponding relationships.

Generally speaking, the difficulty level of a flip-chip package using pre-assignment routing is much higher than that of a flip-chip package using free assignment routing. However, since most of the integrated circuit or package design engineers are used to predetermining the corresponding relationships between the driver pads and the bump pads, and since the routing tool software used in the pre-assignment routing method can also be used to evaluate the aforementioned corresponding relationship, the pre-assignment routing method is still used frequently for the flip-chip package technology in the industrial field.

Currently, there is an integer linear programming algorithm that can be used to calculate the routing paths of a flip-chip package using the pre-assignment routing method. The integer linear programming algorithm includes two stages: in the first stage, the routing path for the connection between each driver pad and its corresponding bump pad is generally determined; in the second stage, details are provided to complete the aforementioned routing paths. However, one of the disadvantages of the integer linear programming algorithm is that it needs a lot of time for the computation. Therefore, the integer linear programming algorithm is unsuitable for the semiconductor field that focuses on efficiency and development costs.

Therefore, the semiconductor field needs a routing method and device for a flip-chip package that can not only efficiently determine the routing path for connection between each driver pad and its corresponding bump pad in the flip-chip package technology, but also reduce the routing length needed.

SUMMARY

The routing method and device for a flip-chip package disclosed in the present invention set several sequences based on the arrangement orders of several pads on a chip and use an algorithm to calculate the longest common subsequence to establish the connection relationships of the aforementioned several pads. The routing method and device for flip-chip package also set several pad arrays based on the arrangement order of several pads on a chip and use an algorithm to obtain the minimum detour connection between the various pad arrays.

The present invention provides a routing method for a flip-chip package. The aforementioned flip chip includes several outer pads and several inner pads. The aforementioned routing method includes the following steps: setting an outer sequence based on the arrangement order of the aforementioned outer pads; setting several inner sequences based on the connection relationships between aforementioned inner pads and the aforementioned outer pads; calculating the longest common subsequence of each inner sequence and the aforementioned outer sequence, defining the connection relationships between the aforementioned inner pads and the aforementioned outer pads corresponding to the longest common subsequence as direct connections, and defining the connection relationships between the aforementioned inner pads and the aforementioned outer pads that do not correspond to the aforementioned longest common subsequence as detour connections; establishing the routing scheme of the aforementioned flip chip based on the connection relationships between the aforementioned inner pads and the aforementioned outer pads.

The present invention pertains to a routing method and device thereof for a flip-chip package. The aforementioned flip chip includes several outer pads and several inner pads. The aforementioned routing method includes the following steps: setting several pad arrays based on the arrangement orders of the aforementioned outer pads and inner pads; establishing the routing path sequentially from the innermost pad array toward the outer pad arrays and selecting a routing path that can provide the most direct connections between each pad array and the pad array on top of it.

The present invention provides a device used for establishing a routing method for a flip chip. The aforementioned flip chip includes several outer pads and several inner pads. The aforementioned device includes an order arranging unit, a calculation unit, and a routing unit. The order arranging unit arranges the aforementioned outer pads into an outer sequence and the aforementioned inner pads into several inner sequences. The calculation unit calculates the longest common subsequence of the aforementioned outer sequence and inner sequences based on the order arrangement results of the aforementioned order arranging unit. The routing unit establishes the routing scheme of the aforementioned outer pads and inner pads based on the calculation results of the aforementioned calculation unit.

The present invention also provides a device used for establishing the routing method of a flip-chip package. The aforementioned flip chip includes several outer pads and several inner pads. The aforementioned device includes an order arranging unit and a routing unit. The aforementioned order arranging unit arranges the aforementioned outer pads and inner pads into several pad arrays. The aforementioned routing unit establishes the routing paths of the aforementioned outer pads and inner pads sequentially from the innermost pad array toward the outer pad arrays based on the order arrangement result of the aforementioned order arranging unit so that the detour connection needed for the routing paths between each pad array and the pad array one layer above is minimized.

Since the algorithm used in the routing method and device for a flip-chip package disclosed in the present invention only needs a short period of time for the computation, the routing method for a flip-chip package provided by the present invention can significantly shorten the computation time needed.

DETAILED DESCRIPTION

The routing method and device for a flip-chip package disclosed in the present invention set the arrangement order of several outer pads of a chip into an outer sequence and set the arrangement orders of the several inner pads of the chip into several inner sequences. Then, the longest common subsequence algorithm is used to calculate the longest common subsequence between each inner sequence and the outer sequence in order to define the connection relationship between each outer pad and its corresponding inner pad based on the aforementioned longest common subsequence. Since the longest common subsequence can be calculated by the dynamic programming method within polynomial time, the routing method for a flip-chip package disclosed in the present invention can significantly shorten the computation time.

Figure 1:
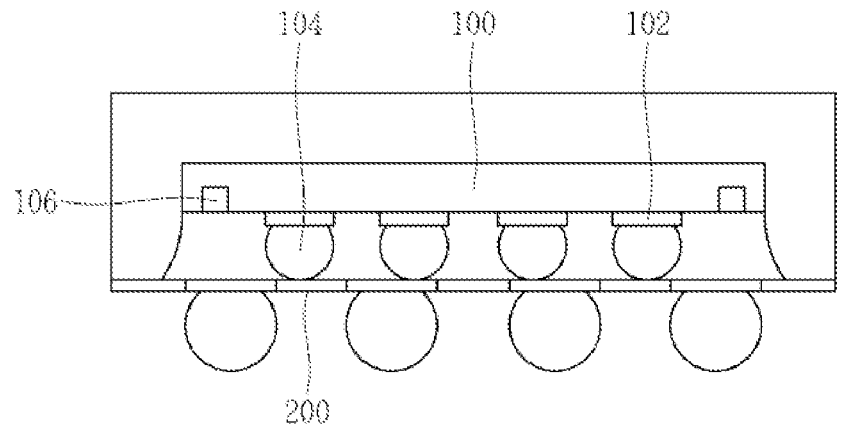
FIG. 1 is a diagram illustrating a flip-chip package.
Figure 2:
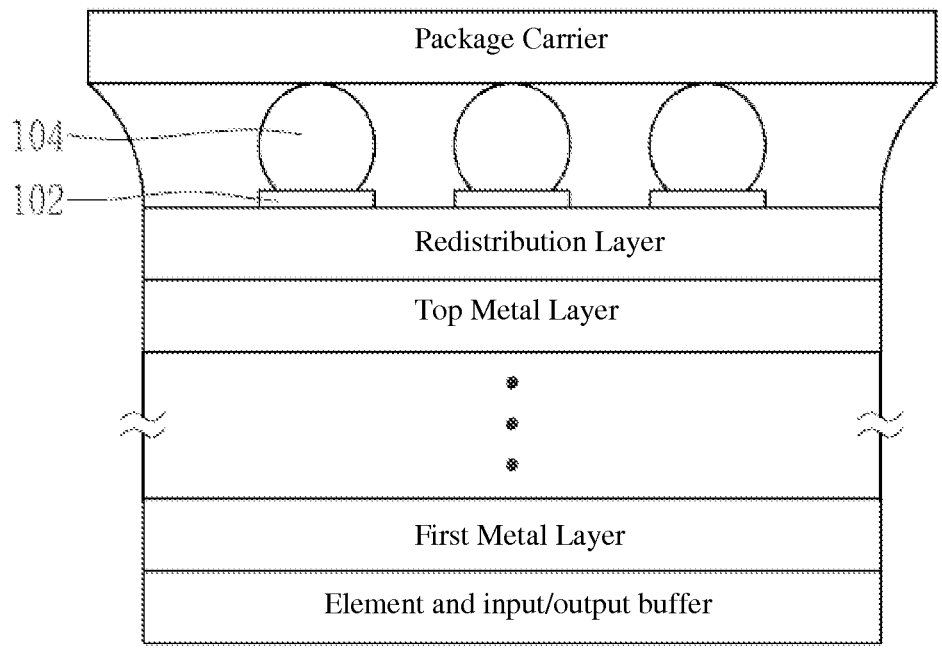
FIG. 2 is the cross-sectional view of a flip-chip package of FIG. 1.
Figure 3:
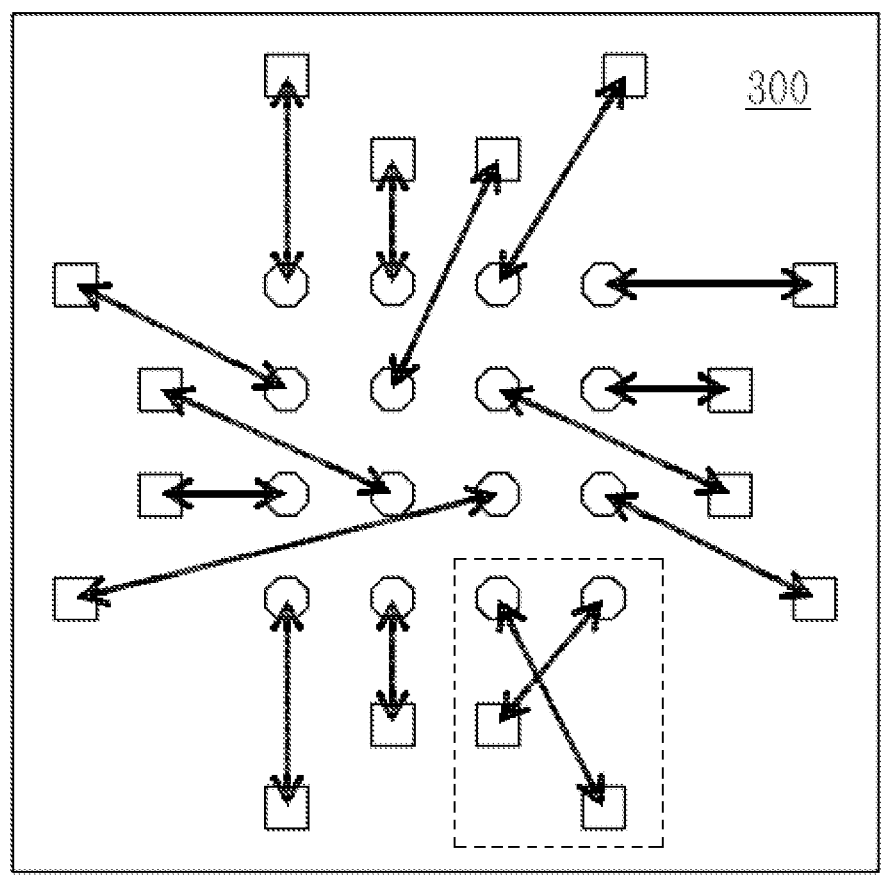
FIG. 3 shows the connection relationships between several driver pads and bump pads of a flip chip.
Figure 4:
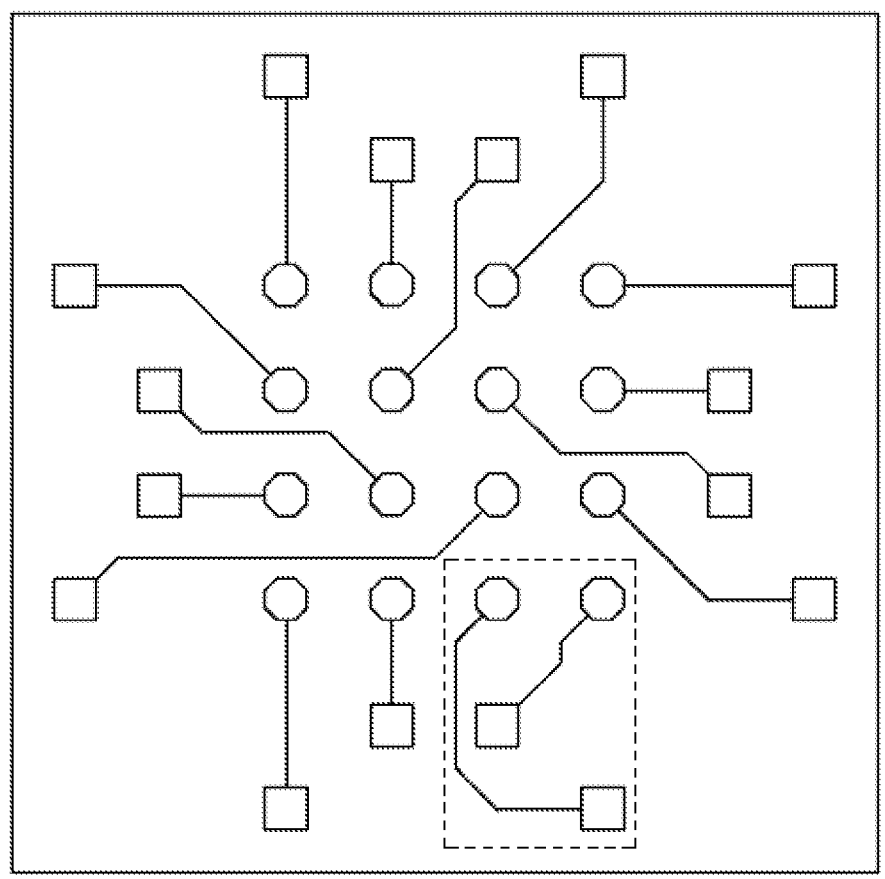
FIG. 4 shows the routing paths between several driver pads and bump pads of a flip chip.

FIG. 3 shows the connection relationships between several driver pads and bump pads of a flip chip. As shown in FIG. 3, the flip chip 300 has 16 driver pads and 16 bump pads. The driver pads are represented by squares, while the bump pads are represented by octagons. Among the aforementioned connection relationships, except for the two driver pads and two bump pads encircled by the broken line in the lower right corner, the connection relationships between the rest of the driver pads and bump pads have no crossed routing. Since the routing of most of the flip chips is completed in the same metal layer, that is, the redistribution layer, crossed routing is not allowed to occur. In other words, the routing of the two driver pads and the two bump pads encircled by the broken line in the lower right corner must be completed by means of detour connections. FIG. 4 shows the routing paths between several driver pads and bump pads of the flip chip 300. As shown in FIG. 4, one of the two driver pads and the two bump pads encircled by the broken line in the lower right corner is routed by means of a direct connection, while the other is routed by means of a detour connection.

For the connection relationships of the flip chip shown in FIG. 3, it can be visually determined which connection relationships can be routed by means of direct connections and which connection relationships can be routed by means of detour connections. However, the flip-chip package that is currently used in the industrial field includes so many driver pads and bump pads that it is impossible to determine the connection relationships between the driver pads and bump pads with just the naked eye. Therefore, the routing method and device for a flip-chip package disclosed in the present invention use the longest common subsequence algorithm to calculate the minimum detour connection relationships needed in order to reduce the routing length needed.

Figure 5:
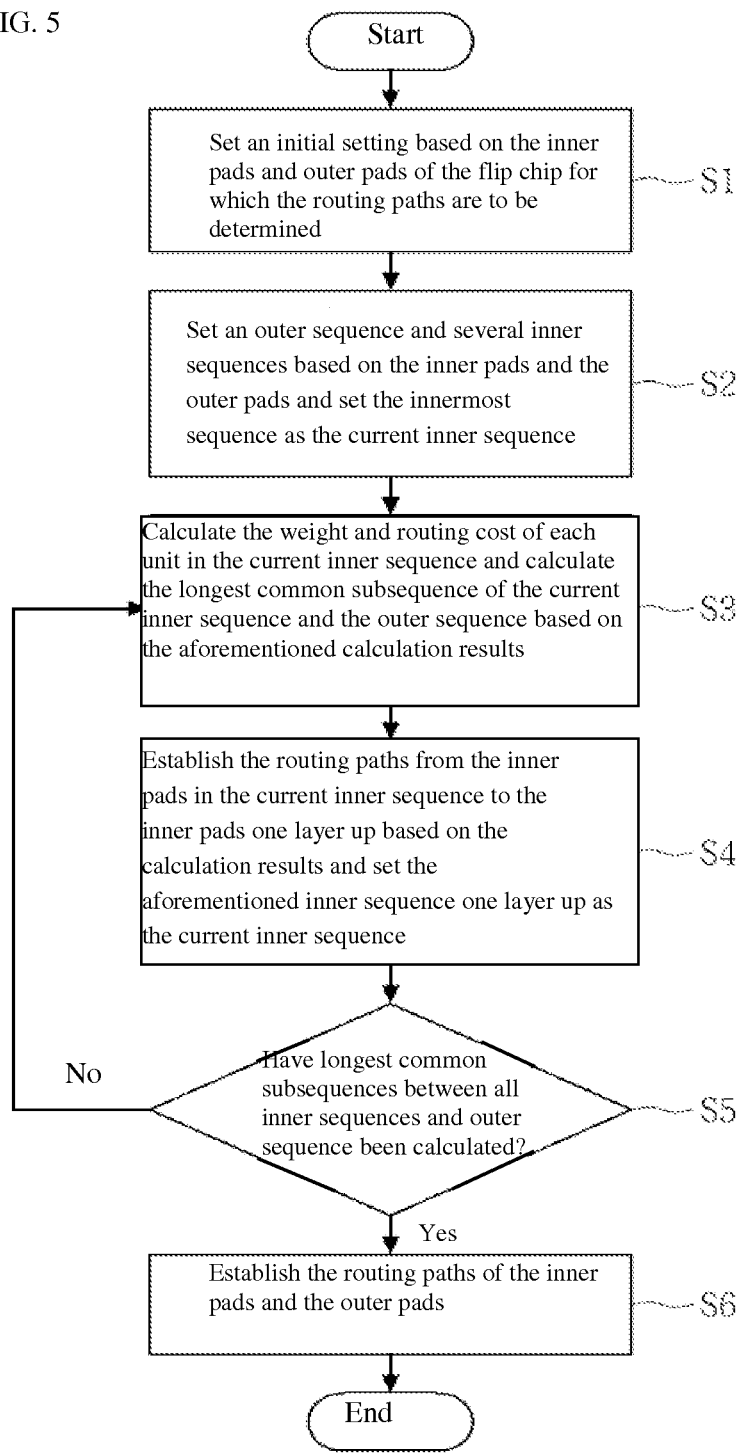
FIG. 5 shows the flow chart of the routing method disclosed in an application example of the present invention when it is applied to a flip chip.

FIG. 5 shows the flow chart of the routing method disclosed in an application example of the present invention when it is applied to a flip chip. In step S1, an initial setting is set based on the several inner pads and outer pads in the flip chip for which the routing paths are to be determined, followed by going to step S2. In step S2, an outer sequence (a sequence is also referred to as an array) and several inner sequences are set based on the aforementioned inner pads and outer pads, and the innermost sequence is set as the current inner sequence, followed by going to step S3. In step S3, the weight and routing cost of each unit in the current inner sequence are calculated, and the longest common subsequence between the current inner sequence and the outer sequence is calculated based on the aforementioned calculation results, followed by going to step S4. The weight corresponds to the number of the detour connections of the connection relationship corresponding to each unit. Therefore, a unit with a higher weight will be given a direct connection relationship of higher priority. The routing cost refers to the extra detour length needed for the other connection relationships that adopt detour connection relationships, if the connection relationship corresponding to a unit is a direct connection relationship. Therefore, a unit with a lower routing cost will be given a direct connection relationship of higher priority. In step S4, the routing paths from the inner pads corresponding to the current inner sequence to the inner pads one layer up are established based on the calculation results, followed by going to step S5. In step S5, it is determined whether the longest common subsequences of all of the inner sequences and the outer sequence have been calculated. If the answer is yes, the process goes to step S6. Otherwise, the step returns to step S3. In step S6, the routing paths of the aforementioned inner pads and outer pads are established.

In another embodiment, steps S3 through S5 can alternatively be as follows. In step S3, the virtual pads of the current inner pad array are established in the inner pad array on the current inner pad array, and the virtual pads of the pads that are detour connected in the aforementioned upper inner pad array are established in the aforementioned upper inner pad array. A virtual ring is established based on the current inner pad array and the inner pad array on the current inner pad array, followed by going to step S4. In step S4, the chords on the aforementioned virtual ring are established based on the algorithm of maximum planar subset of chords and the connection relationships of the pads on the virtual ring in order to define the connection relationships corresponding to the aforementioned chords as direct connections and to define the connection relationships not corresponding to the aforementioned chords as detour connections. The aforementioned upper inner pad array is then set as the current inner pad array, followed by going to step S5. In step S5, it is determined whether the connection relationships of all the inner pad arrays have been defined. If the answer is yes, the process goes to step S6. Otherwise, the process returns to step S3. In step S6, the routing paths of the aforementioned inner pads and outer pads are established.

Figure 6:
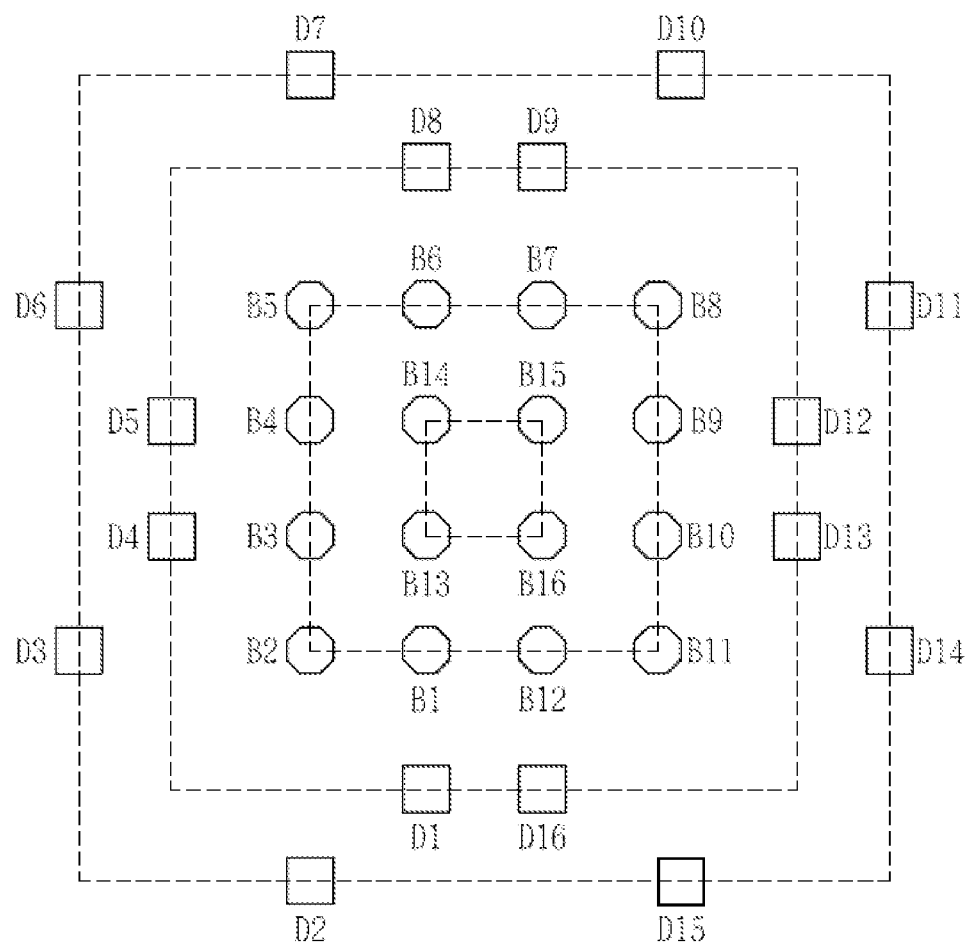
FIG. 6 shows the connection relationships between several driver pads and bump pads of a flip chip in an application example of the present invention.

As shown in FIG. 3 again and according to the method shown in FIG. 5, in step S1, flip chip 300 is set initially. As shown in FIG. 6, the 16 driver pads of the flip chip 300 are defined as the outer pads, while the 16 bump pads are defined as the inner pads. The aforementioned outer pads can be divided into a first outer pad ring and a second outer pad ring. The first outer pad ring includes driver pads D2, D3, D6, D7, D10, D11, D14, and D15, while the second outer pad ring includes driver pads D1, D4, D5, D8, D9, D12, D13, and D16. The aforementioned inner pads can also be divided into a first inner pad ring and a second inner pad ring. The first inner pad ring includes bump pads B1-B12, while the second inner pad ring includes bump pads B13-B16.

Figure 7:
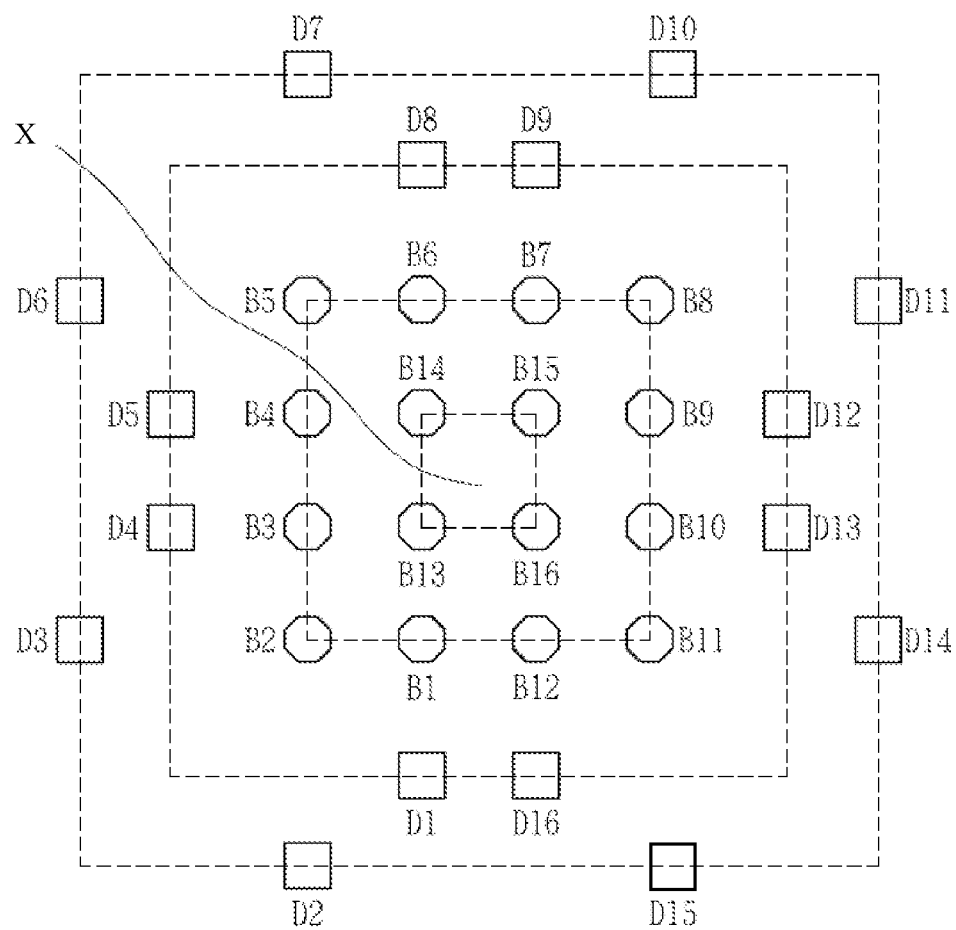
FIG. 7 shows the cutting line in an application example of the present invention.

In step S2, an outer sequence and several inner sequences are set based on the aforementioned inner pad rings and outer pad rings. First, as shown in FIG. 7, the aforementioned outer pad rings and inner pad rings are cut open by a cutting line X and are expanded into several sequences. The aforementioned cutting line cannot cut the connection relationships between the aforementioned outer pads and inner pads. If there is no such cutting line, the head/tail units of the outer sequence can be duplicated to the head/tail parts of the outer sequence. For example, an outer sequence (1, 4, 1, 2, 5, 2, 3, 6, 3) can be duplicated into (3, 6, 3, 1, 4, 1, 2, 5, 2, 3, 6, 3, 1, 4, 1).

Figure 8:
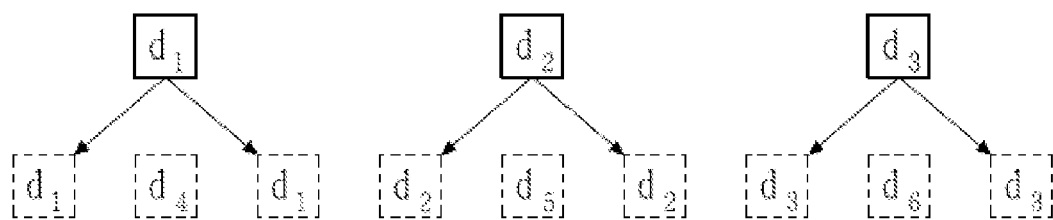
FIG. 8 shows the virtual pads in an application example of the present invention.

The routing method used for a flip-chip package disclosed in this application example changes the order of the inner pads in the aforementioned inner sequences to match the order of the outer sequence as much as possible in order to reduce the number of detour connections. Therefore, the routing method for a flip-chip package disclosed in this application example uses virtual pads to represent the possible arrangement order of the aforementioned outer pads. As shown in FIG. 8, in another application example, a flip chip has a first outer sequence and a second outer sequence. The first outer sequence includes a total of three outer pads d1-d3, while the second outer sequence includes a total of three outer pads d4-d6. The aforementioned outer pad d1 is connected to an inner pad. The aforementioned connection can pass on the left or right side of the outer pad d4. Therefore, the aforementioned first and second outer sequences can be combined into one outer sequence (1, 4, 1, 2, 5, 2, 3, 6, 3) as shown in FIG. 8. Again, as shown in FIG. 3, since the aforementioned sequence in this application example does not have various different paths, in other words, since all the paths except for the connection relationships shown in FIG. 3 are detour connections, the aforementioned first and second outer sequences can be combined into one outer sequence (7, 8, 9, 10, 11, 12, 13, 14, 15, 16, 1, 2, 3, 4, 5, 6).

Figure 9A:
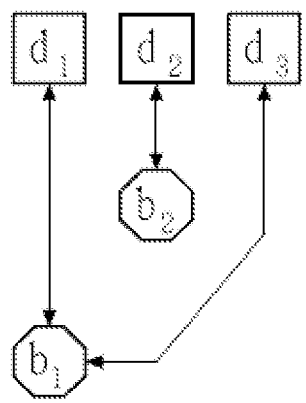
FIGS. 9A-9C show the virtual pads in another application example of the present invention.
Figure 9B:
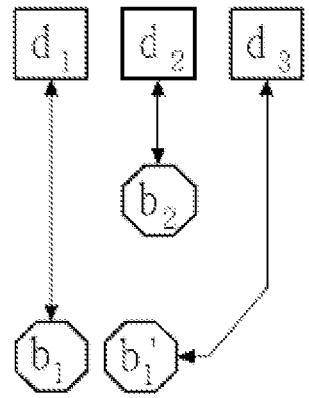
Figure 9C:
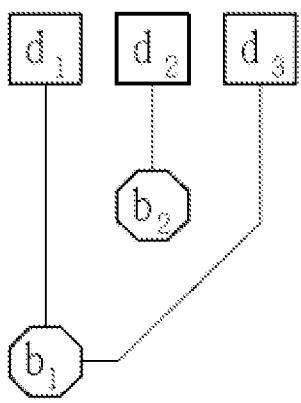

In yet another application example of the present invention, a flip chip has a connection relationship that connects three or more pads. As shown in FIG. 9A, a flip chip includes a connection relationship that connects two outer pads d1 and d3 with an inner pad b1. In the aforementioned application example, a duplicated virtual pad b1' is generated beside inner pad b1. The inner pad b1 is connected to the outer pad d1, and the virtual pad b1' is connected to the outer pad d3 as shown in FIG. 9B. After routing is finished, the inner pad b1 and virtual pad b1' are combined as shown in FIG. 9C. Again, as shown in FIG. 3, since this application example does not include any connection relationship that connects more than three pads, there is no need to generate a virtual pad.

Figure 10:
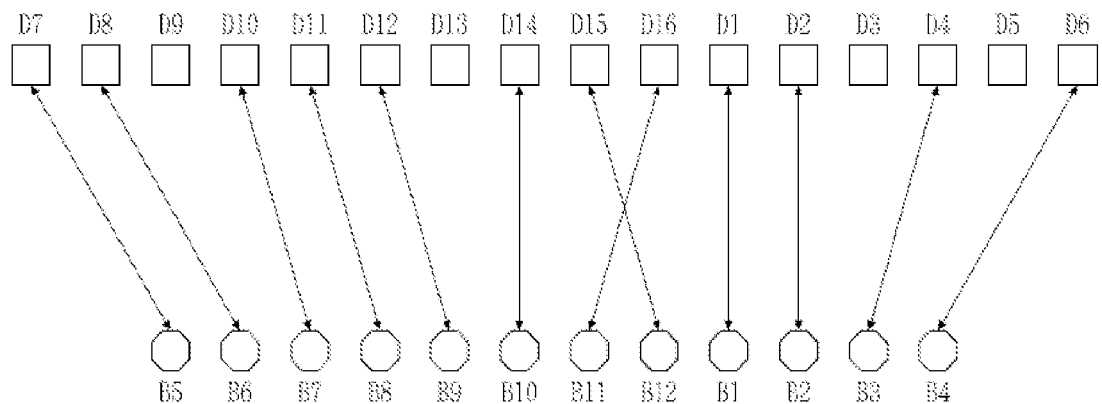
FIG. 10 shows the connection relationships between the inner pads of the first layer and the pads represented by an outer sequence in an application example of the present invention.
Figure 11:
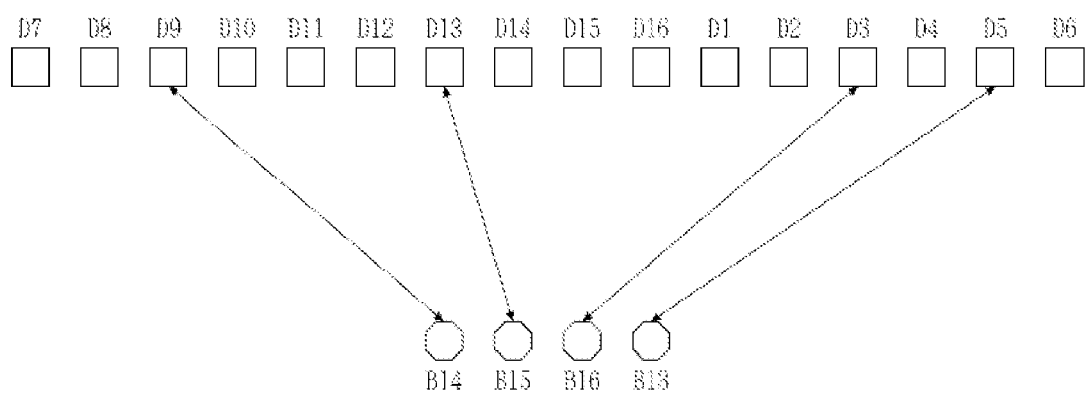
FIG. 11 shows the connection relationships between the inner pads of the second layer and the pads represented by an outer sequence in an application example of the present invention.

FIG. 10 shows the connection relationships between the inner pads of the first layer and the pads represented by the outer sequence. Based on the aforementioned connection relationships, the first inner sequence is defined as (7, 8, 10, 11, 12, 14, 16, 15, 1, 2, 4, 6). FIG. 11 shows the connection relationships between the inner pads of the second layer and the pads represented by the outer sequence. Based on the aforementioned connection relationships, the second inner sequence is defined as (9, 13, 3, 5). Then, the innermost sequence is set as the current inner sequence. That is, the second inner sequence is set as the current inner sequence.

Figures 12, 13:
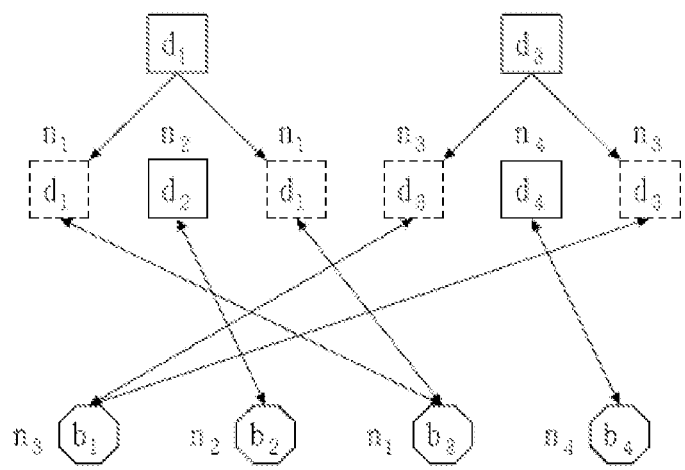
FIG. 12 shows the connection relationships between an inner pad and the pads represented by an outer sequence in another application example of the present invention.
FIG. 13 shows the calculation result of the longest common subsequence according to an application example of the present invention.

In step S3, the weight and routing cost of each unit in the current inner sequence are calculated, and the longest common subsequence of the current inner sequence and the outer sequence is calculated based on the aforementioned calculation results. The weight of each unit in the current inner sequence is equal to the number calculated by subtracting the number of crossed routing paths that each unit has with the other connection relationships from the number of connections in the current inner sequence. In another application example of the present invention, a flip chip includes an outer sequence (1, 2, 1, 3, 4, 3) and an inner sequence (3, 2, 1, 4). FIG. 12 shows the connection relationships between the pads represented by the aforementioned outer sequence and inner sequence. As shown in FIG. 12, the aforementioned connection relationship n3 has three crossed routing paths, while connection relationship n2 has two crossed routing paths and connection relationship n1 has two crossed routing paths. The connection relationship n4 has one crossed routing path. Therefore, the weights of the inner sequence (3, 2, 1, 4) are (2, 2, 1, 3).

For the current inner sequence (9, 13, 3, 5) in this application example, as shown in FIG. 11, since none of the connection relationships has a crossed routing path, the weights of the current inner sequence are (4, 4, 4, 4), and the routing costs of the current inner sequence are (0, 0, 0, 0). Then, the longest common subsequence of the current inner sequence (9, 13, 3, 5) and the outer sequence (7, 8, 9, 10, 11, 12, 13, 14, 15, 16, 1, 2, 3, 4, 5, 6) is calculated based on the aforementioned weights and routing costs. The longest common subsequence can be calculated using any known algorithm or any other algorithm. Those skilled in this field can easily obtain the calculation method of the longest common subsequence. In this application example, the calculation is carried out based on the following pseudo codes.

```
Input:      Sd, Sb, W, C
Output:     Sw
for i = 0 to |Sb|
    F[i][0] = 0 ;
    G[i][0] = 0 ;
for i = 1 to |Sd|
    F[0][i] = 0 ;
    G[0][i] = 0 ;
```

-continued

```
for i = 0 to |Sb|
    for j = 1 to |Sd|
        if Sb[i] = Sd[j]
            k = F[i − 1][j − 1] + W[Sb[i]] ;
            l = G[i − 1][j − 1] + C[Sb[i]] ;
        else
            k = F[i − 1][j − 1] ;
            l = G[i − 1][j − 1] ;
        Select the maximum value from F[i − 1][j], F[i][j − 1], and k;
        If the values of F[i − 1][j], F[i][j − 1], and k are equal to each other,
        make the selection based on the minimum value of G[i − 1][j],
        G[i][j − 1], and l;
        if selecting F[i − 1][j]
            F[i][j] = F[i − 1][j];
            G[i][j] = G[i − 1][j];
            H[i][j] = 'up';
        else if selecting F[i][j − 1]
            F[i][j] = F[i][j − 1];
            G[i][j] = G[i][j − 1];
            H[i][j] = 'left';
        else
            F[i][j] = k;
            G[i][j] = l;
            H[i][j] = 'upper left';
i = |Sb|
j = |Sd|
while i is not equal to 0 and j is not equal to 0
    if H[i][j] = 'up'
        i = i − 1
    else if H[i][j] = 'left'
        j = j − 1;
    else
        if Sb[i] = Sd[j]
            insert Sb[i] to Sw;
        i = i − 1;
        j = j − 1;
reverse the order of Sw;
return Sw.
```

Sd is the outer sequence, Sb is the current outer inner sequence, W is the weight, C is the routing cost, and Sw is the longest common subsequence.

Based on the connection relationships shown in FIG. 12, the result of calculating the longest common subsequence of outer sequence (1, 2, 1, 3, 4, 3) and inner sequence (3, 2, 1, 4) using weights (2, 2, 1, 3) is shown in FIG. 13. The longest common subsequence of outer sequence (1, 2, 1, 3, 4, 3) and inner sequence (3, 2, 1, 4) is derived as (2, 1, 4) by means of reverse deduction from the table shown in FIG. 13.

In this application example, the longest common subsequence of outer sequence (7, 8, 9, 10, 11, 12, 13, 14, 15, 16, 1, 2, 3, 4, 5, 6) and current inner sequence (9, 13, 3, 5) can be calculated as (9, 13, 3, 5). Therefore, the connection relationships between outer pad D5 and inner pad B13, between outer pad D9 and inner pad B14, between outer pad D13 and inner pad B15, and between outer pad D3 and inner pad B16 are defined as direct connections.

Figure 14:
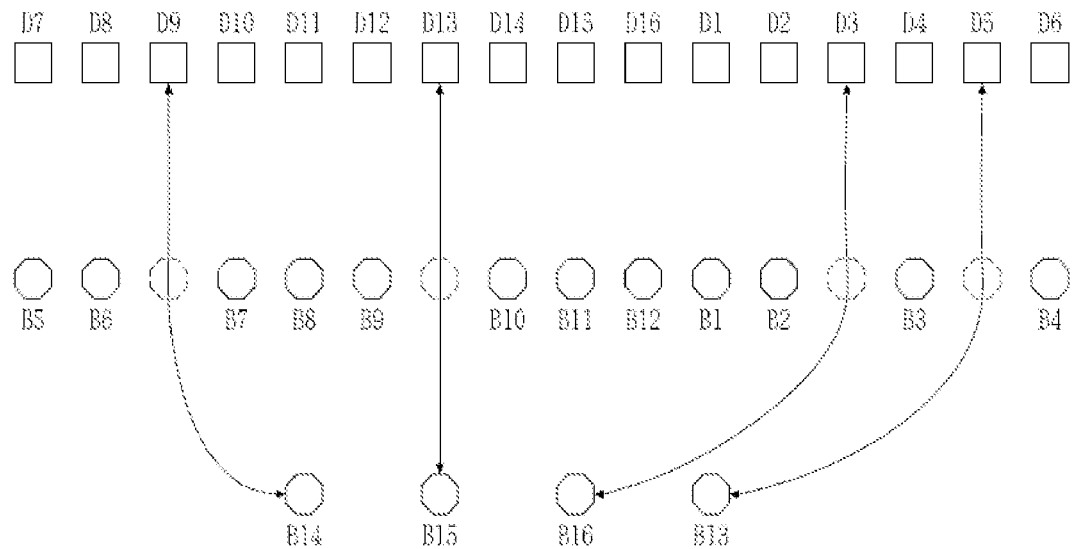
FIG. 14 shows the routing results established based on a calculation result of the longest common subsequence in an application example of the present invention.

In step S4, the routing paths from the inner pads corresponding to the current inner sequence to the inner pads one layer up are established based on the calculation results. FIG. 14 shows the results of establishing the aforementioned routing paths. Connection relationships n3, n5, n9, and n13 are all direct connections. Then, the aforementioned inner sequence one layer up is set as the current inner sequence. That is, the first inner sequence (7, 8, 10, 11, 12, 14, 16, 15, 1, 2, 4, 6) is set as the current inner sequence.

In step S5, it is determined whether the longest common subsequences of all the inner sequences and the outer sequence have been calculated. Since only the longest common subsequence of the second inner sequence and the outer sequence has been calculated, the process returns to step S3.

In step S3, the weight and routing cost of each unit in the current inner sequence are calculated, and the longest common subsequence of the current inner sequence and the outer sequence is calculated based on the aforementioned calculation results. FIG. 10 shows the connection relationships between the inner pads of the first layer and the pads represented by the outer sequence. Therefore, the weights of the first inner sequence (7, 8, 10, 11, 12, 14, 16, 15, 1, 2, 4, 6) can be calculated as (12, 12, 12, 12, 12, 12, 12, 12, 12, 12, 11, 11), while the routing costs are (4, 4, 4, 4, 4, 4, 4, 4, 4, 4, 4, 6). The longest common subsequence of the first inner sequence (7, 8, 10, 11, 12, 14, 16, 15, 1, 2, 4, 6) and the outer sequence (7, 8, 9, 10, 11, 12, 13, 14, 15, 16, 1, 2, 3, 4, 5, 6) can be calculated based on the aforementioned weights and routing costs as (7, 8, 10, 11, 12, 14, 15, 1, 2, 4, 6).

Figure 15:
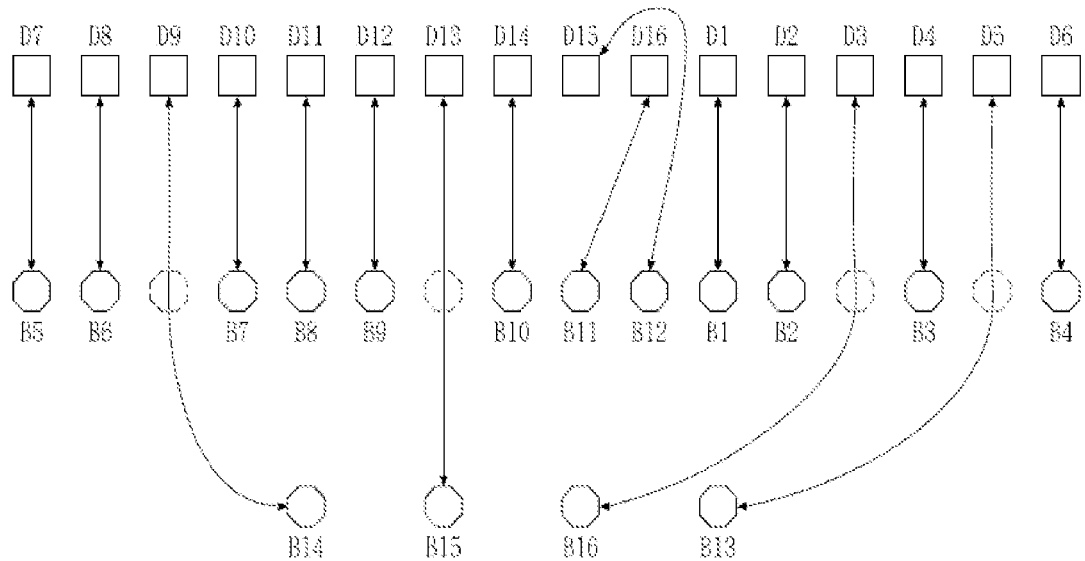
FIG. 15 shows the routing results established based on another calculation result of the longest common subsequence in an application example of the present invention.

In step S4, the routing paths from the inner pads corresponding to the current inner sequence to the inner pads one layer up are established based on the calculation results. FIG. 15 shows the results of establishing the aforementioned routing paths. Connection relationship n16 is a detour connection, while the other connection relationships are all direct connections.

In step S5, it is determined whether the longest common subsequences of all the inner sequences and the outer sequence have been calculated. Since the longest common subsequences of the two inner sequences and the outer sequence have been calculated, the process goes to step S6.

In step S6, the routing paths of the inner pads and outer pads are established. The completed routing results are as shown in FIG. 4.

Figure 16:
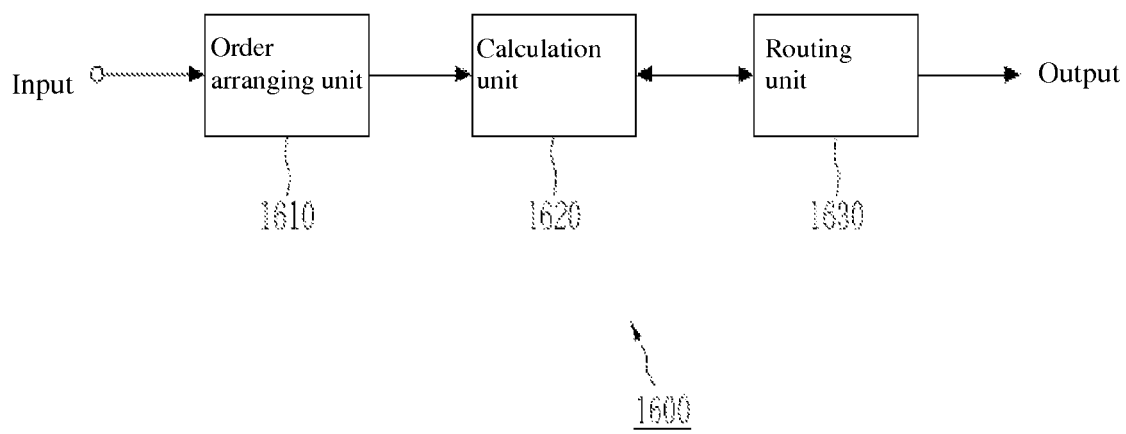
FIG. 16 shows the device used for establishing the routing method for a flip-chip package in an application example of the present invention.

FIG. 16 shows a device used for realizing the routing method for a flip-chip package in an application example of the present invention. As shown in FIG. 16, the device 1600 includes an order arranging unit 1610, a calculation unit 1620, and a routing unit 1630. The order arranging unit 1610 is used to arrange the several outer pads of a flip chip into an outer sequence and arrange the several inner pads of the flip chip into several inner sequences. The calculation unit 1620 calculates the longest common subsequences of the aforementioned outer sequence and inner sequences based on the order arrangement results of the order arranging unit 1610. The routing unit 1630 establishes the routing scheme of the outer pads and inner pads based on the calculation results of the calculation unit 1620.

Corresponding to the method disclosed in the present invention, the order arranging unit 1610 sets an initial setting based on the several inner pads and outer pads of a flip chip for which the routing paths are to be determined, and sets an outer sequence and several inner sequences based on the inner pads and outer pads. The calculation unit 1620 calculates the weight and routing cost of each unit in the aforementioned inner sequences and calculates the longest common subsequences of the inner sequences and the outer sequence based on the aforementioned calculation results. The routing unit 1630 establishes the routing paths from the inner pads corresponding to the inner sequence to the inner pads one layer up based on the calculation results of calculation unit 1620 and establishes the routing paths of the aforementioned inner pads and outer pads.

The device shown in FIG. 16 can be realized by hardware or by software via hardware. For example, the aforementioned device can be realized by using a computer executing a program.

Figure 17:
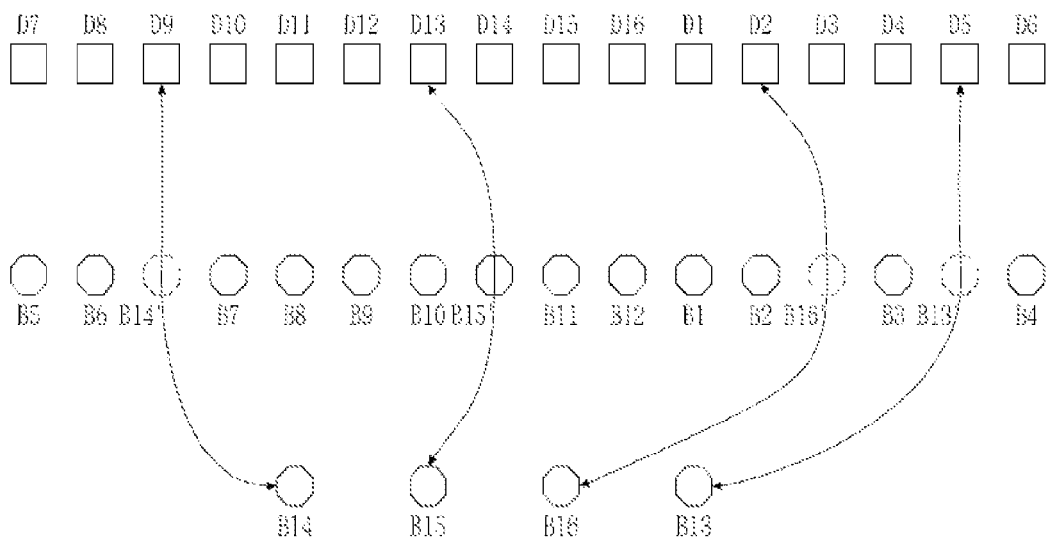
FIG. 17 is a diagram illustrating the situation when the virtual pads in the current inner pad array are established in the inner pad array on the current pad array in an application example of the present invention.

FIG. 17 is a diagram illustrating the situation when the virtual pads of the second inner pad array are established in the first inner pad array. The routing method for flip-chip package disclosed in this application example is such that the aforementioned virtual pads and the arrangement order of the aforementioned upper inner pad array satisfy the arrangement order of the aforementioned outer pad array as much as possible in order to maximize the direct connection relationships. As shown in FIG. 17, the virtual pad B14' of inner pad B14 is located between inner pads B6 and B7, so that the connection relationship between the inner pad B14 and outer pad D9 becomes a direct connection relationship. Similarly, the virtual pad B15' of inner pad B15 is located between inner pads B10 and B11. The virtual pad B16' of inner pad B16 is located between inner pads B2 and B3. The virtual pad B13' of inner pad B13 is located between inner pads B3 and B4. Therefore, the connection relationship between inner pad B15 and outer pad D13, the connection relationship between inner pad B16 and outer pad D2, and the connection relationship between inner pad B13 and outer pad D5 all become direct connection relationships.

Figure 18:
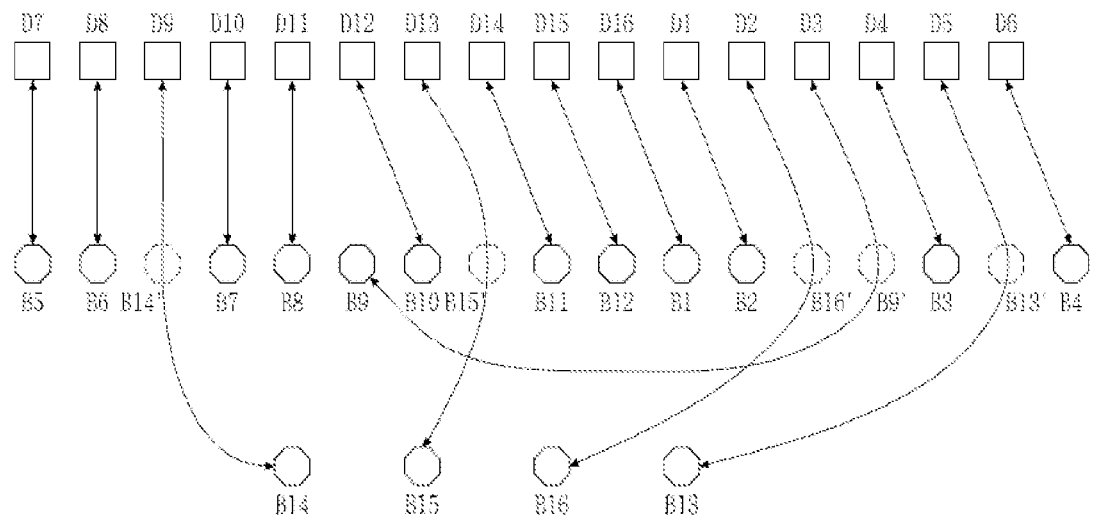
FIG. 18 is a diagram illustrating the situation when the virtual pads of the pads that are detour connected in an upper inner pad array are established in the aforementioned upper inner pad array in an application example of the present invention.

FIG. 18 is a diagram illustrating the situation when the virtual pads of the pads that are detour connected in the first inner pad array are established in the aforementioned first inner pad array. As shown in FIG. 18, the virtual pad B9' of inner pad B9 is established between inner pad B3 and the virtual pad B16' so that the connection relationship between the virtual pad B9' and the outer pad D2 becomes a direct connection.

Figure 19:
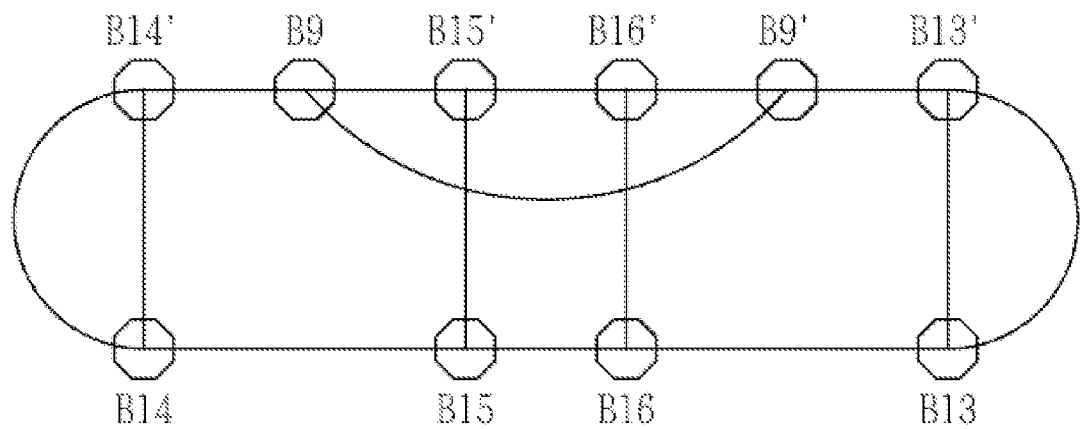
FIG. 19 shows the virtual ring in an application example of the present invention.

Then, a virtual ring is established between the first inner pad array and the second inner pad array. FIG. 19 shows the established virtual ring. The aforementioned virtual ring has the virtual pads B14', B15', B16', B13', B9' on the aforementioned first inner pad array, pad B9 that is detour connected, and the pads B13-B16 on the second inner pad array. As shown in FIG. 19, five chords can be established on the aforementioned virtual ring based on the connection relationships between the aforementioned pads on the aforementioned virtual ring.

In step S4, the chords on the virtual ring are established based on the algorithm of maximum planar subset of chords and the connection relationships between the pads on the aforementioned virtual ring in order to define the connection relationships corresponding to the aforementioned chords as direct connections and define the connection relationship not corresponding to the chords as detour connections. The routing method for flip-chip package disclosed in this application example uses the algorithm of maximum planar subset of chords to find the most chords that can coexist without crossing with each other on the virtual ring. The calculation of the algorithm of maximum planar subset of chords can be carried out based on any currently known algorithm or any other algorithm. Those skilled in this field can easily obtain the calculation method of the algorithm of maximum planar subset of chords.

Figure 20:
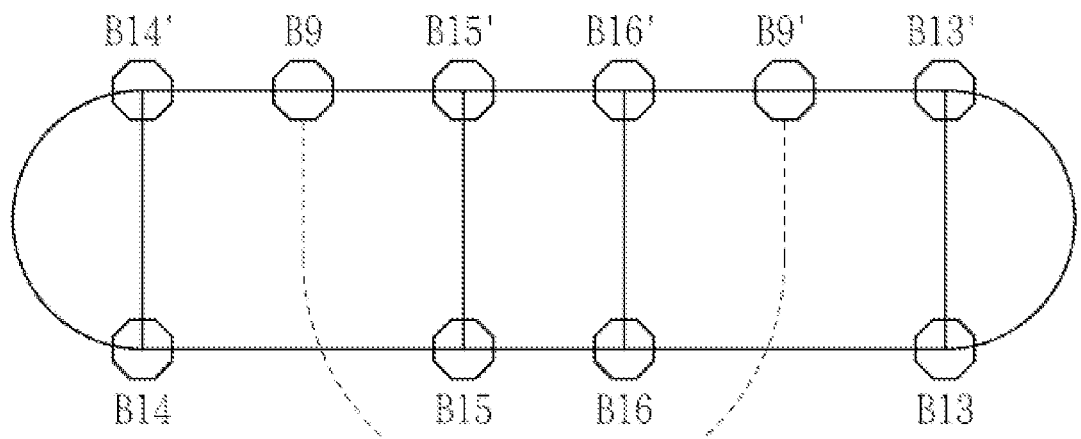
FIG. 20 shows the calculation results of the algorithm of maximum planar subset of chords in an application example of the present invention.

As shown in FIG. 20, according to the algorithm of maximum planar subset of chords, a total of four chords between pad B13 and its virtual pad B13', pad B14 and its virtual pad B14', pad B15 and its virtual pad B15', and pad B16 and its virtual B16' can coexist on the aforementioned virtual ring. The corresponding connection relationships are direct connections. The connection relationship between pad B9 and its virtual pad B9' is defined as a detour connection. Then, the aforementioned first inner pad array is set as the current inner pad array.

In step S5, it is determined whether the connection relationships between all of the inner pad arrays have been defined. Since the connection relationships between the first inner pad array and the second inner pad array have been established, the process goes to step S6.

Figure 21:
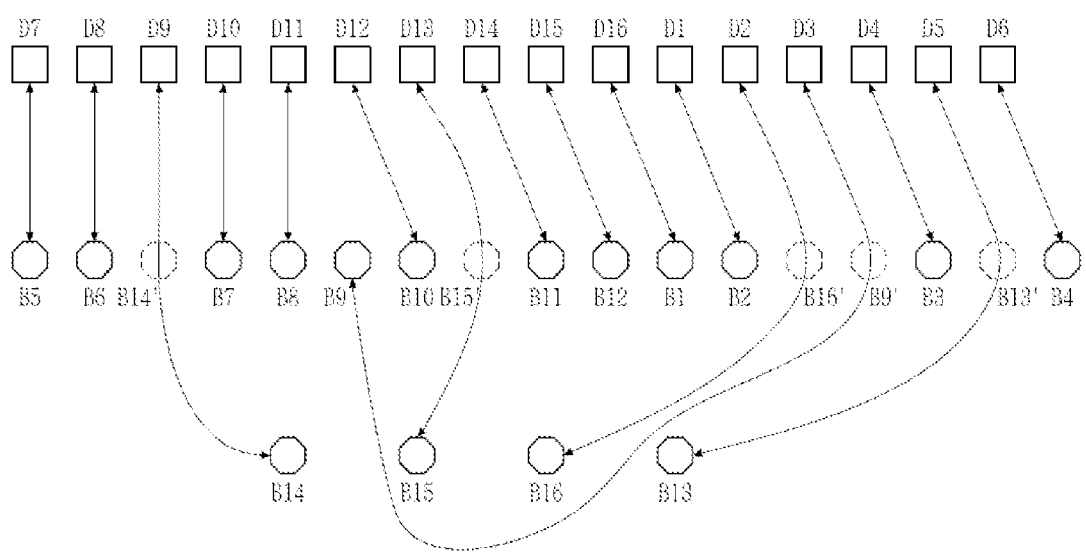
FIG. 21 shows the routing results established based on an application example of the present invention.
Figure 23:
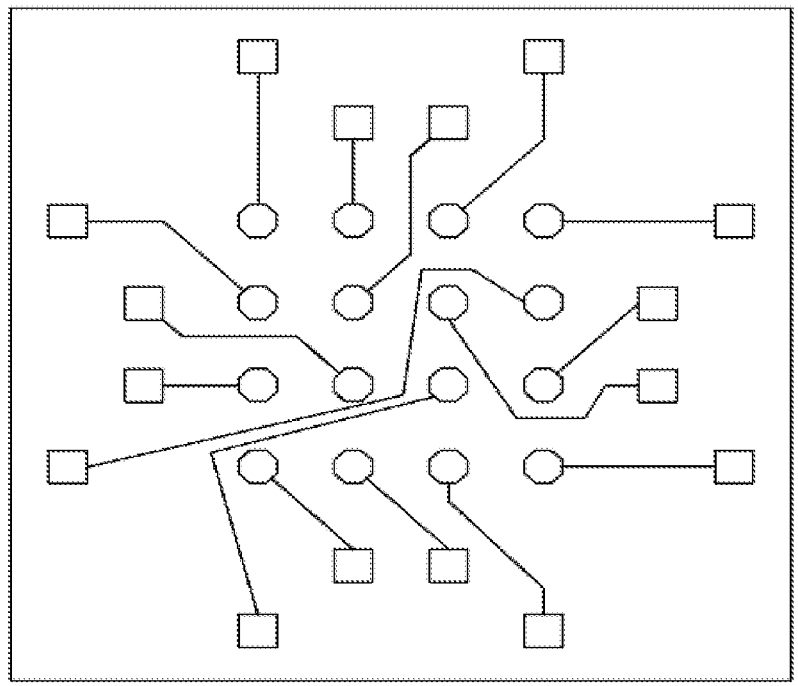
FIG. 23 shows the routing paths based on FIG. 21.

In step S6, the routing paths of the aforementioned inner pads and outer pads are established. Based on the routing paths shown in FIG. 21, the routing of flip chip 300 is completed, and the result is as shown in FIG. 23.

Figure 22:
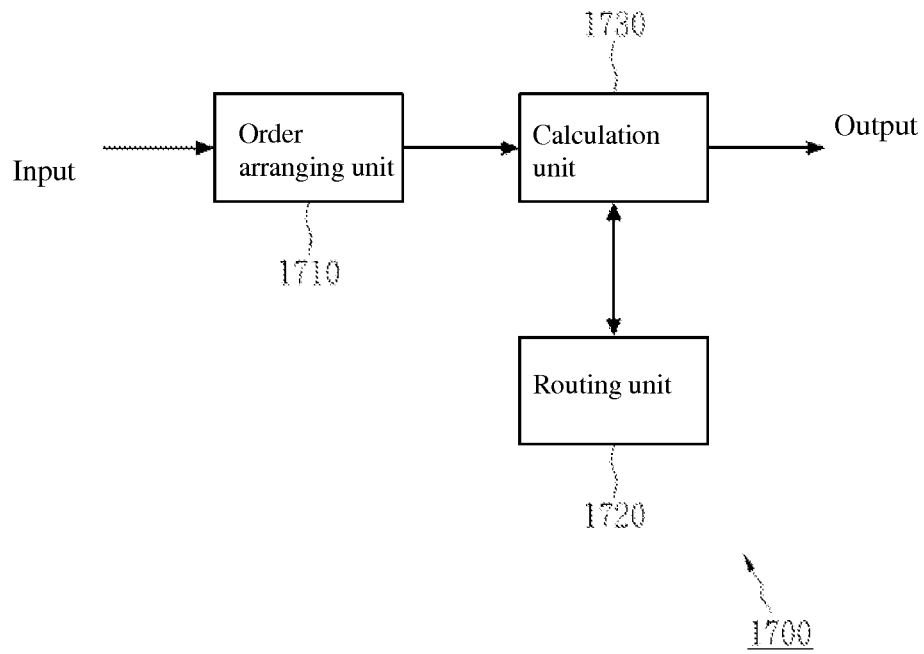
FIG. 22 is a diagram illustrating the device used for establishing the routing method of a flip-chip package in an application example of the present invention.

FIG. 22 is a diagram illustrating the device for realizing the routing method for the flip-chip package disclosed in an application example of the present invention. As shown in FIG. 22, the device 1700 includes an order arranging unit 1710, a calculation unit 1720, and a routing unit 1730. The order arranging unit 1710 arranges several outer pads and inner pads into several pad arrays. The calculation unit 1720 defines the connection relationships between the outer pads and the inner pads based on the routing result of routing unit 1730 and the algorithm of maximum planar subset of chords and provides the calculation results to routing unit 1730 in order to establish the routing paths of the outer pads and the inner pads. The routing unit 1730 establishes a virtual ring based on the arrangement results of the order arranging unit and establishes the routing paths of the aforementioned outer pads and inner pads sequentially from the innermost pad array based on the calculation result of the calculation unit 1720 so that the detour connection needed for routing paths between each pad array and the pad array one layer above is minimized.

Corresponding to the method disclosed in the present invention, the order arranging unit 1710 performs initial setting based on the several inner pads and outer pads of the flip chip for which the routing paths are to be determined and sets an outer pad array and several inner pad arrays based on the aforementioned inner pads and outer pads. With respect to individual inner pad array, the routing unit 1730 establishes the virtual pads of the aforementioned inner pad array in the inner pad array one layer above, establishes the virtual pads of the pads that are detour connected in the aforementioned upper inner pad array in the upper inner pad, and establishes a virtual ring based on the aforementioned inner pad array and the pad array one layer above. Also, the routing unit 1730 establishes the routing paths of the inner pads and the outer pads. The calculation unit 1720 establishes the chords on the virtual ring based on the algorithm of maximum planar subset of chords and the connection relationships between the pads on the aforementioned virtual ring in order to define the connection relationships corresponding to the aforementioned chords as direct connections and to define the connection relationship not corresponding to the chords as detour connections.

The device shown in FIG. 22 can be realized in a hardware form or by using software realized by hardware. For example, to sum up, the routing method for a flip-chip package and the device used for realizing this method disclosed in the present invention sets the arrangement order of several outer pads of a chip into an outer pad array and sets the arrangement order of several inner pads of the aforementioned chip into several inner pad arrays. Then, the connection relationships between the inner pad arrays are established by using the algorithm of maximum planar subset of chords in order to minimize the detour connections needed. Since the algorithm of maximum planar subset of chords can carry out calculation using the dynamic programming method within the polynomial time, the routing method for a flip-chip package provided by the present invention can significantly reduce the operation time needed. Also, since the routing traces between each pad array and the pad array one layer above only need a minimum detour connection, the objective of reducing the routing length required can be achieved.

In summary, the routing method and device for a flip-chip package disclosed in the present invention sets the arrangement order of several outer pads of a chip into an outer sequence and sets the arrangement orders of the several inner pads of the chip into several inner sequences. Then, the longest common subsequence algorithm is used to calculate the longest common subsequence between each inner sequence and the outer sequence in order to define the connection relationship between each outer pad and its corresponding inner pad based on the aforementioned longest common subsequence. Since the longest common subsequence can be calculated by the dynamic programming method within polynomial time, the routing method for a flip-chip package disclosed in the present invention can significantly shorten the computation time. In addition, since the routing method and device for a flip-chip package disclosed in the present invention are used to find the routing scheme with the minimum number of detour connections, it is possible to reduce the routing length needed.

The technical content and characteristics of the present invention have been described above. However, those skilled in this field can still make substitutions and modifications without departing from the gist of the present invention. The protection scope of the present invention is not limited to the application examples but should also include the aforementioned substitutions and modifications that do not depart from the gist of the present invention. The protection scope is covered by the claims.

What is claimed is:

1. A routing method for a flip-chip package including a flip chip having outer pads and inner pads, the routing method comprising:
   setting several pad arrays based on an arrangement order of the outer pads and the inner pads of the flip chip;
   establishing, with a computer, a routing path sequentially from an innermost pad array toward outer pad arrays, wherein establishing the routing path comprises:
     establishing a virtual ring including virtual pads based on a current pad array of the several pad arrays and a pad array directly above; and
     establishing chords on the virtual ring based on a maximum planar subset of chords and connection relationships between the virtual pads on the virtual ring; and
   selecting the routing path configured to provide a most direct connection between each pad array and the pad array directly above.

2. The routing method described in claim 1, wherein establishing the routing path further comprises:
   setting the innermost pad array as the current pad array;
   establishing virtual pads of the current pad array;
   establishing the virtual pads that are detour connected in the current pad array;
   defining the connection relationships corresponding to the chords as direct connections and defining the connection relationships not corresponding to the chords as detour connections; and
   setting the pad array directly above the current pad array as the current pad array and repeating the steps of establishing the virtual ring and defining the connection relationships until definition is complete.

3. The routing method described in claim 2, wherein setting the innermost pad array comprises cutting a pad ring with a cutting line and expanding the pad ring.

4. The routing method described in claim 2, wherein if a connection relationship connects three or more pads, establishing the virtual pads comprises:
   generating virtual inner pads so that each connection relationship only connects two pads.

5. The routing method described in claim 1, wherein the arrangement order of the outer pads and the inner pads is several pad rings formed on the flip chip.

6. The routing method described in claim 1, wherein, if the arrangement order of the outer pads forms several outer pad arrays, the method further comprises combining the several outer pad arrays.

7. The routing method described in claim 6, wherein combining the several outer pad arrays comprises using virtual pads to represent a possible arrangement order of the outer pads, with the virtual pads representing possible routing paths of the corresponding outer pads.

8. A routing device for a flip-chip package including a flip chip comprising:
   an order arranging unit configured to arrange outer pads and inner pads of the flip-chip into pad arrays;
   a routing unit configured to establish routing paths sequentially from an innermost pad array toward outer pad arrays based on an arrangement from the order arranging unit, the routing paths established to minimize detour connections for routing paths between each pad array and a pad array directly above; and
   a calculation unit configured to calculate connection relationships between the outer pads and the inner pads based on routing results of the routing unit and a maximum planar subset of chords, and provide calculation results to the routing unit to establish the routing paths of the outer pads and the inner pads.

9. A non-transitory computer readable medium including program instructions executable by one or more computers that, when executed, cause the one or more computers to perform operations for a routing method for a flip-chip package including a flip chip having outer pads and inner pads, the operations comprising:
   setting several pad arrays based on an arrangement order of the outer pads and the inner pads of the flip chip;
   establishing, with a computer, a routing path sequentially from an innermost pad array toward outer pad arrays, wherein establishing the routing path comprises:
      establishing a virtual ring including virtual pads based on a current pad array of the several pad arrays and a pad array directly above; and
      establishing chords on the virtual ring based on a maximum planar subset of chords and connection relationships between the virtual pads on the virtual ring; and
   selecting the routing path configured to provide a most direct connection between each pad array and the pad array directly above.

* * * * *